(12) United States Patent
Kang

(10) Patent No.: US 10,649,297 B2
(45) Date of Patent: May 12, 2020

(54) PIXEL STRUCTURE

(71) Applicant: HANNSTAR DISPLAY CORPORATION, Taipei (TW)

(72) Inventor: Mu-Kai Kang, Pingtung County (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 8 days.

(21) Appl. No.: 16/152,352

(22) Filed: Oct. 4, 2018

(65) Prior Publication Data

US 2019/0171048 A1   Jun. 6, 2019

(30) Foreign Application Priority Data

Dec. 5, 2017   (CN) .......................... 2017 1 1267191

(51) Int. Cl.
*G02F 1/1368* (2006.01)
*G02F 1/1362* (2006.01)
*G02F 1/1343* (2006.01)
*H01L 27/12* (2006.01)
*G02F 1/1335* (2006.01)
*G02F 1/1339* (2006.01)
*H01L 29/786* (2006.01)
*H01L 29/49* (2006.01)
*H01L 29/08* (2006.01)

(52) U.S. Cl.
CPC ...... *G02F 1/1368* (2013.01); *G02F 1/134363* (2013.01); *G02F 1/136286* (2013.01); *H01L 27/1222* (2013.01); *G02F 1/13394* (2013.01); *G02F 1/133512* (2013.01); *G02F 1/133514* (2013.01); *G02F 2001/134318* (2013.01); *G02F 2001/134381* (2013.01); *G02F 2201/121* (2013.01); *G02F 2201/123* (2013.01); *G02F 2202/10* (2013.01); *H01L 27/1225* (2013.01); *H01L 29/0847* (2013.01); *H01L 29/4908* (2013.01); *H01L 29/7869* (2013.01)

(58) Field of Classification Search
CPC ............. G02F 1/1368; G02F 1/136227; G02F 2001/13685
See application file for complete search history.

(56) References Cited

U.S. PATENT DOCUMENTS

2016/0204137 A1* 7/2016 Wu .................. H01L 29/66969
                                                             257/43

* cited by examiner

*Primary Examiner* — Dung T Nguyen
(74) *Attorney, Agent, or Firm* — Winston Hsu

(57) ABSTRACT

A pixel structure includes a substrate, a thin film transistor and a common electrode. The thin film transistor is disposed on the substrate, wherein a semiconductive active layer of the thin film transistor has a channel region disposed between a source and a drain, the channel region includes a main channel region and at least one sub channel region, a channel length of the main channel region is less than a channel length of the at least one sub channel region, and the channel length of the main channel region is equal to a minimum of a channel length of the channel region. The common electrode is disposed on the thin film transistor, and the common electrode overlaps at least a portion of the at least one sub channel region, wherein the common electrode has an opening exposing the main channel region.

22 Claims, 11 Drawing Sheets

PIXEL STRUCTURE

CROSS REFERENCE TO RELATED APPLICATION

This application claims the priority benefit of China Patent Application Serial No. 201711267191.8, filed Dec. 5, 2017. The entirety of the above-mentioned patent application is hereby incorporated herein by reference and made a part of this specification.

BACKGROUND OF THE INVENTION

1. Field of the Invention

The present invention relates to a pixel structure, and more particularly to a pixel structure which can decrease a leakage current.

2. Description of the Prior Art

Since a liquid crystal display has the characteristics of thin appearance, low power consumption and no radiation pollution, it has been widely used in many kinds of portable or wearable electronic products, such as notebooks, smart phones, watches, and display devices in vehicles, for transmitting and displaying information more conveniently. Generally, the display has a plurality of pixels configured to provide different colors and different luminances of light to be display units for displaying frames.

In the structure of the pixel, a thin film transistor (TFT) is used to be a switch controlling the change of luminance. However, the existing thin film transistor has a leakage current in actual operation, such that the frames shown by the display are abnormal, such as exhibiting flicker or crosstalk. Accordingly, the leakage current in the pixel needs to be improved.

SUMMARY OF THE INVENTION

The present invention provides a pixel structure, and a transparent conductive layer of the pixel structure covers a portion of a semiconductive active layer and is provided with a suitable voltage for decreasing the leakage current in the pixel structure.

In order to solve the above problems, the present invention provides a pixel structure including a substrate, a thin film transistor and a common electrode. The substrate has a surface. The thin film transistor is disposed on the surface of the substrate, and the thin film transistor includes a gate, a source, a drain, a gate insulating layer (GI layer) and a semiconductive active layer, wherein the gate, the source and the drain respectively overlap a portion of the semiconductive active layer in a direction perpendicular to the surface, the GI layer is disposed between the gate and the semiconductive active layer, the semiconductive active layer has a channel region disposed between the source and the drain, the channel region includes a main channel region and at least one sub channel region, a channel length of the main channel region is less than a channel length of the at least one sub channel region, and the channel length of the main channel region is equal to a minimum of a channel length of the channel region, wherein the channel length of the channel region is referred to a distance of the channel region from the drain to the source. The common electrode is disposed on the thin film transistor, and the common electrode overlaps at least a portion of the at least one sub channel region, wherein the common electrode has an opening exposing the main channel region.

In order to solve the above problems, the present invention further provides a pixel structure including a first substrate, a thin film transistor, a first transparent conductive layer, a second substrate and a liquid crystal layer. The first substrate has a surface. The thin film transistor is disposed on the first substrate, and the thin film transistor includes a gate, a source, a drain, a GI layer and a semiconductive active layer, wherein the gate, the source and the drain overlap a portion of the semiconductive active layer in a direction perpendicular to the surface respectively, the GI layer is disposed between the gate and the semiconductive active layer, the semiconductive active layer has a channel region disposed between the source and the drain, the channel region comprises a main channel region and at least one sub channel region, a channel length of the main channel region is less than a channel length of the at least one sub channel region, and the channel length of the main channel region is equal to a minimum of a channel length of the channel region, wherein the channel length of the channel region is referred to a distance of the channel region from the drain to the source. The first transparent conductive layer is disposed on the thin film transistor, and the first transparent conductive layer covers at least a portion of the at least one sub channel region, wherein the first transparent conductive layer has an opening exposing the main channel region. The second substrate is disposed on the surface of the first substrate. The liquid crystal layer is disposed between the first substrate and the second substrate.

The common electrode of the pixel structure of the present invention has the opening configured to expose the main channel region and covers at least a portion of the at least one sub channel region. Thus, when the common electrode is provided with the common voltage, because the common electrode does not cover the main channel region, the common electrode does not significantly affect the resistance of the thin film transistor under the condition that the thin film transistor is turned on. On the other hand, when the thin film transistor is turned off, because the common electrode covers at least a portion of the at least one sub channel region, the electrical disconnection effect of the back channel region of the sub channel regions overlapping the common electrode can be enhanced due to the induction of the common voltage, so as to decrease the leakage current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
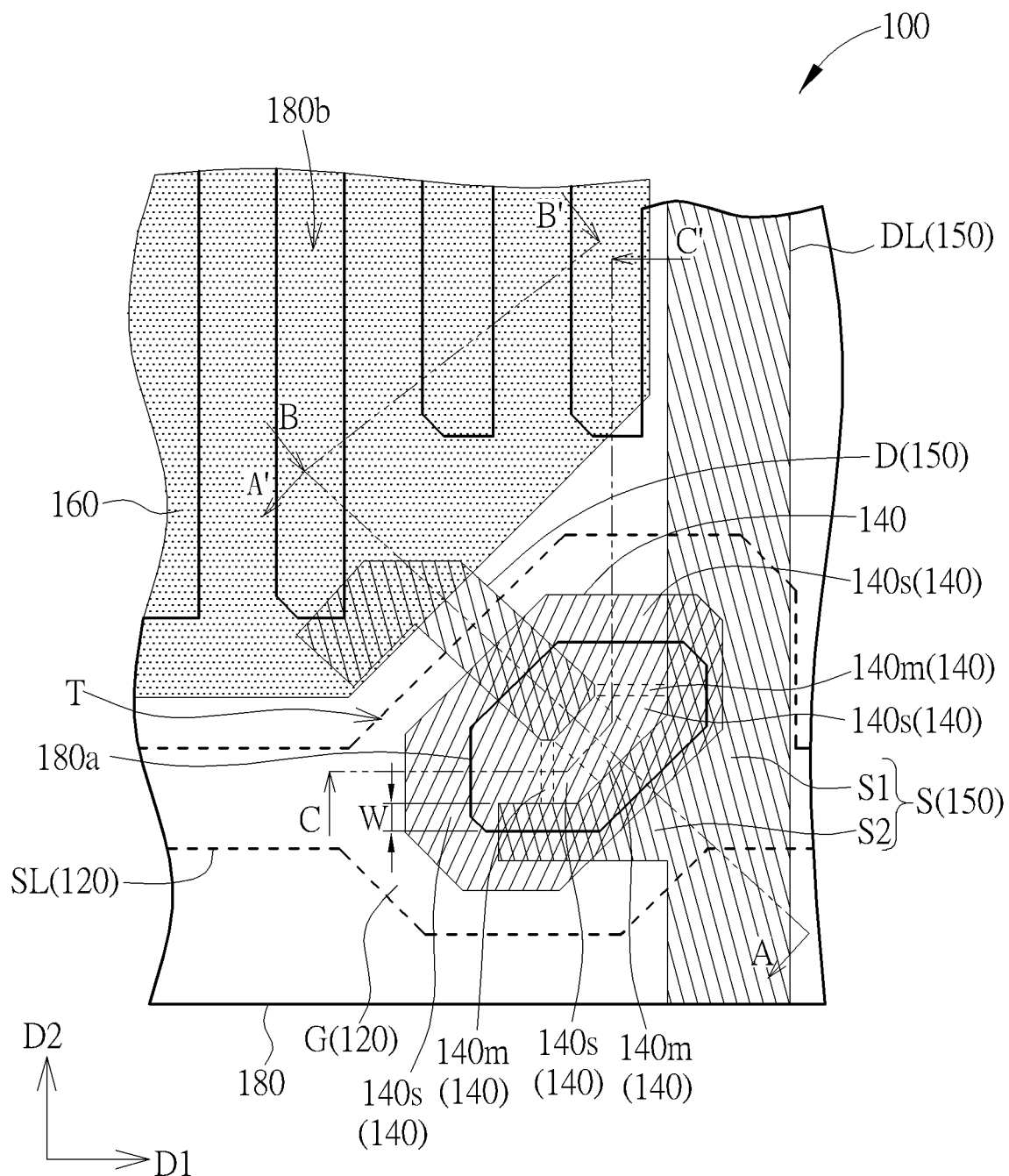
FIG. 1 is a top-view schematic diagram illustrating a portion of a pixel structure according to a first embodiment of the present invention.

To provide a better understanding of the present invention to those skilled in the art, preferred embodiments will be detailed in the follow description. The preferred embodiments of the present invention are illustrated in the accompanying drawings with numbered elements to elaborate on the contents and effects to be achieved. It should be noted that the drawings are simplified schematics, and therefore show only the components and combinations associated with the present invention, so as to provide a clearer description for the basic structure or implementing method of the present invention. The components would be more complex in reality. In addition, for ease of explanation, the components shown in the drawings may not represent their actual number, shape, and dimensions; details may be adjusted according to design requirements.

Figure 2:
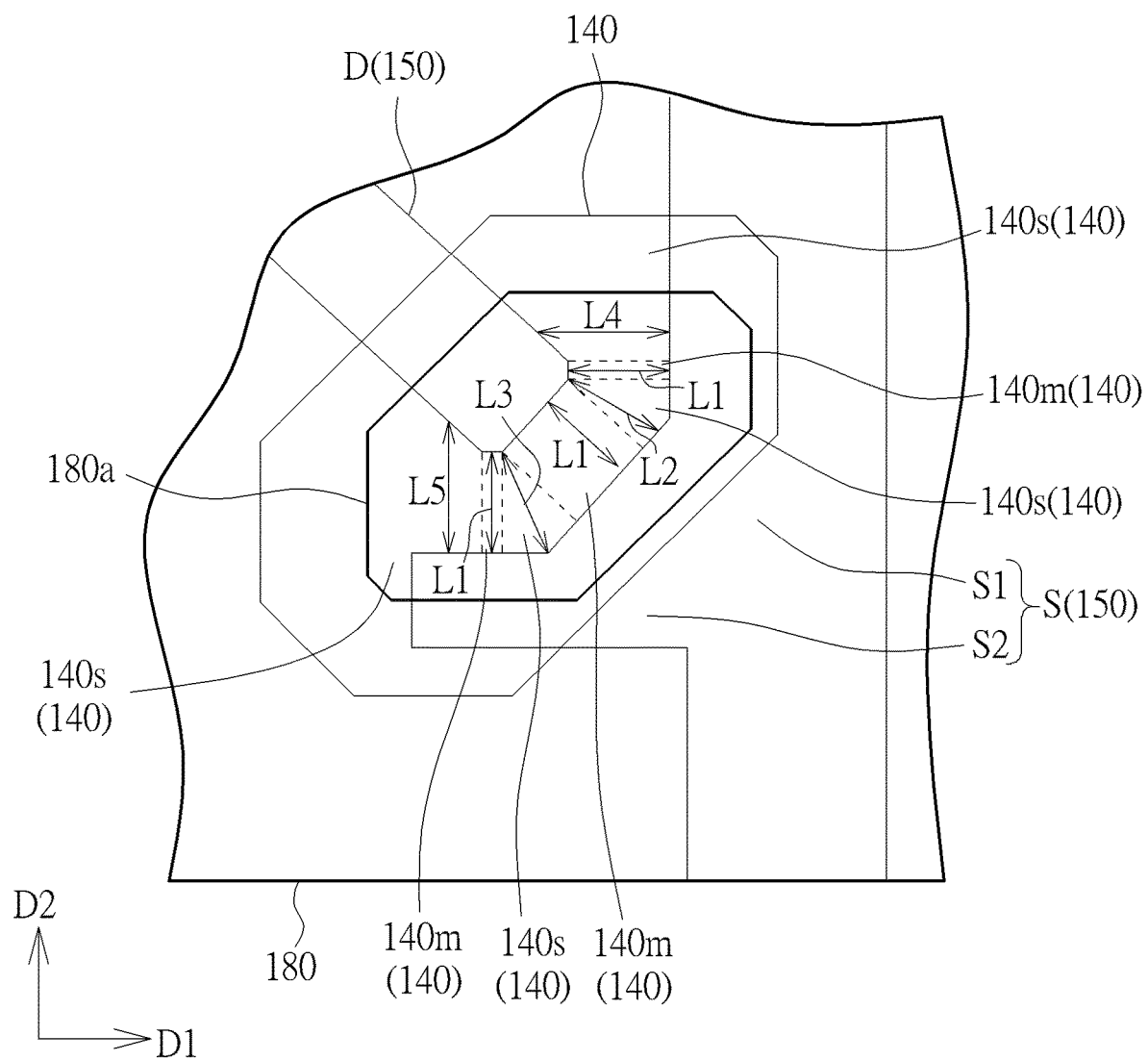
FIG. 2 is a partial enlarged schematic diagram of FIG. 1.
Figure 3:
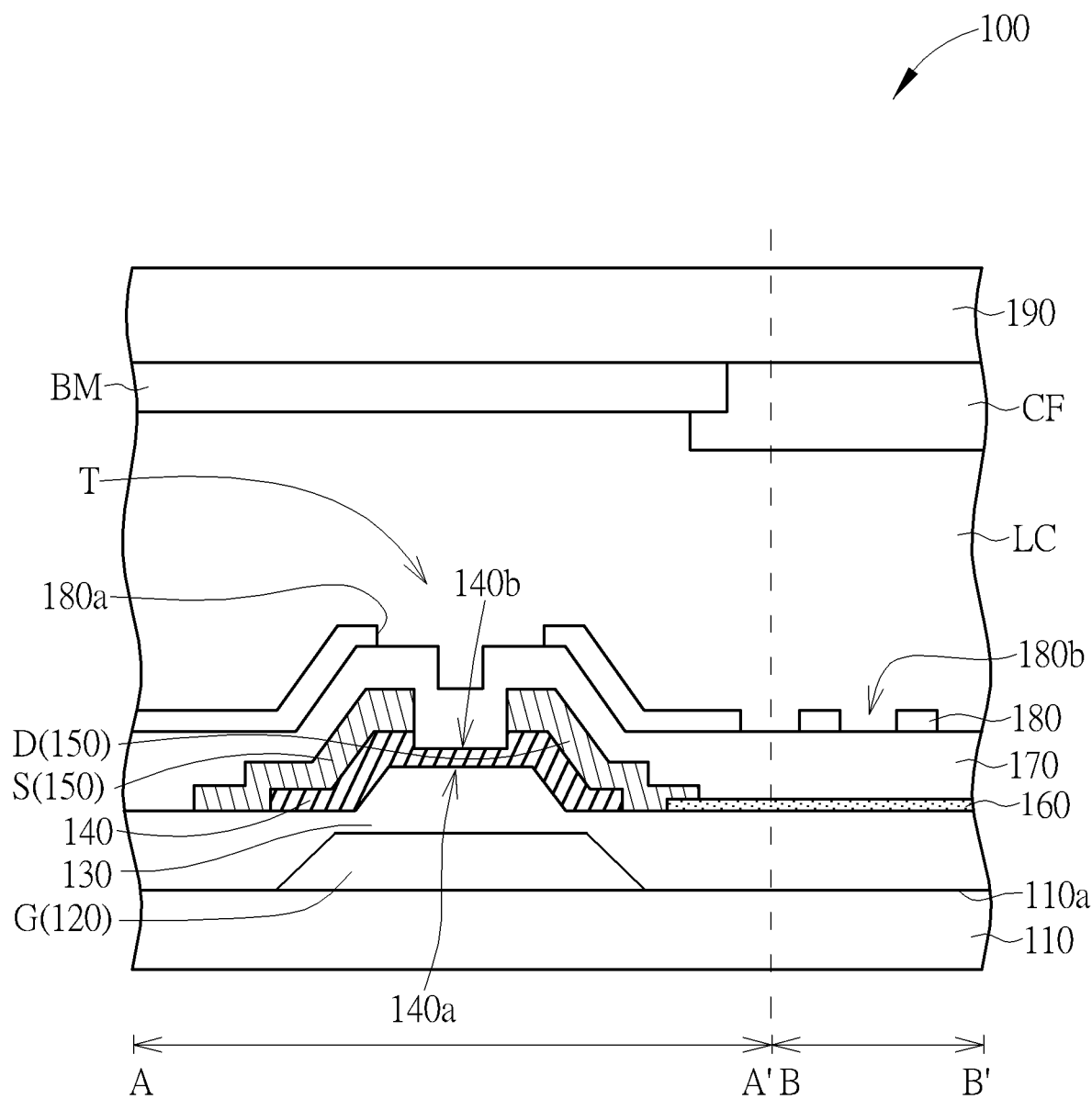
FIG. 3 is a cross-sectional-view schematic diagram taken along cross-sectional lines A-A' and B-B' in FIG. 1.
Figure 4:
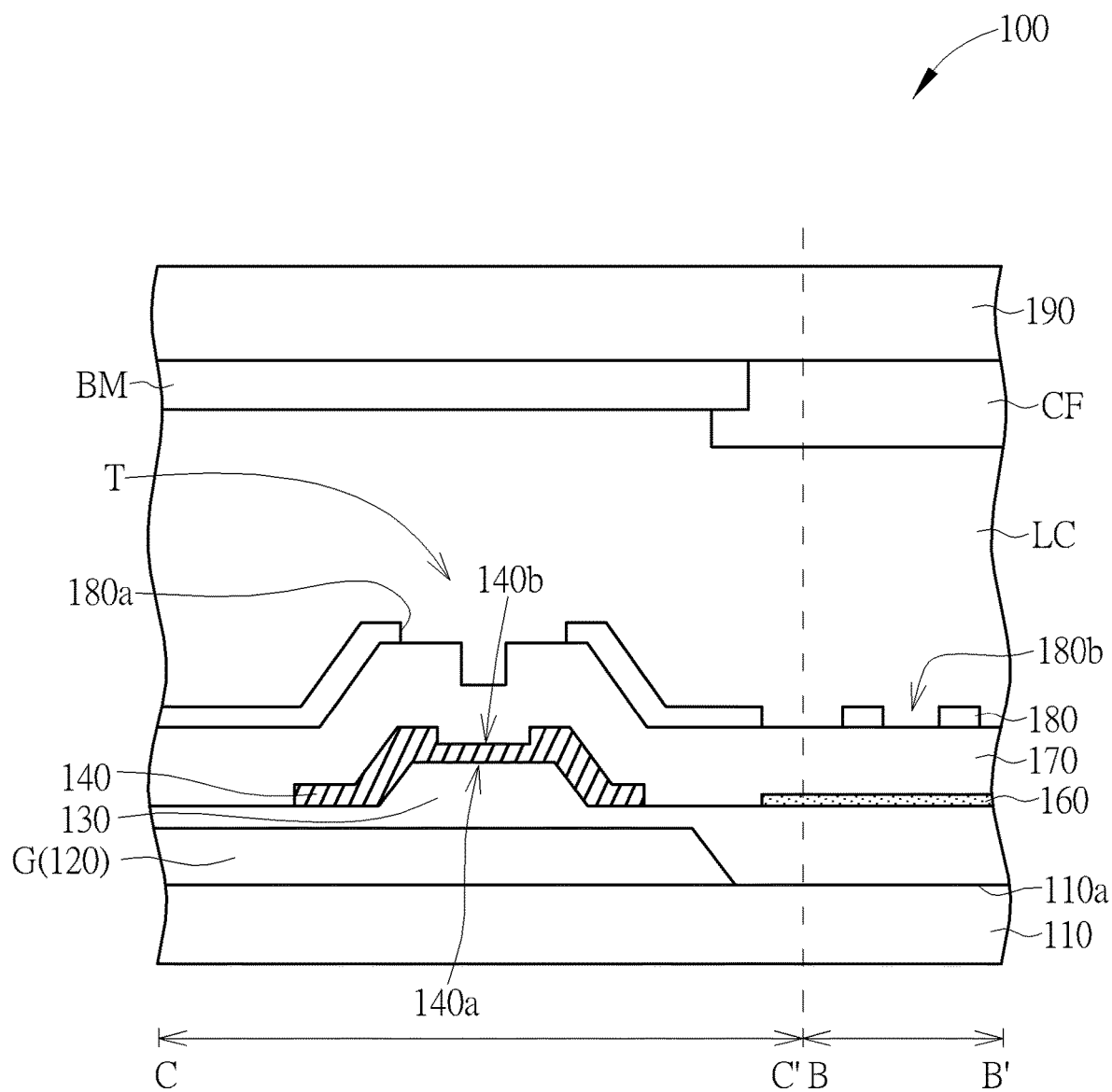
FIG. 4 is a cross-sectional-view schematic diagram taken along cross-sectional lines C-C' and B-B' in FIG. 1

FIG. 1 is a top-view schematic diagram illustrating a portion of a pixel structure according to a first embodiment of the present invention, FIG. 2 is a partial enlarged schematic diagram of FIG. 1, FIG. 3 is a cross-sectional-view schematic diagram taken along cross-sectional lines A-A' and B-B' in FIG. 1, and FIG. 4 is a cross-sectional-view schematic diagram taken along cross-sectional lines C-C' and B-B' in FIG. 1, wherein FIG. 2 does not illustrate screentones of a semiconductive active layer and a second conductive layer in order to clearly show the distribution of regions within the semiconductive active layer. Note that the pixel structure 100 of the present invention may be used in a liquid crystal display, touch sensing display or other suitable displays. Herein, the liquid crystal display is an example for describing, but the display is not limited thereto. In the display or the touch sensing display, the pixel structures 100 of the present invention may be arranged in an array, each of the pixel structures 100 may be a sub-pixel, and one pixel may comprise one or more sub-pixels. For example, one pixel may be composed of three sub-pixels to be a display unit. As shown in FIG. 1 to FIG. 4, the pixel structure 100 of this embodiment includes a first substrate 110, a second substrate 190, a thin film transistor T, a common electrode (or referred as a first transparent conductive layer) 180, a pixel electrode (or referred as a second transparent conductive layer) 160, a first insulating layer 170 and a liquid crystal layer LC. The first substrate 110 is utilized for carrying components of the pixel structures 100, and has a surface 110a. The second substrate 190 is opposite to the first substrate 110; that is, the second substrate 190 is disposed on the surface 110a of the first substrate 110. The first substrate 110 and the second substrate 190 may be a rigid substrate such as a glass substrate, a plastic substrate, a quartz substrate or a sapphire substrate, or a flexible substrate including polyimide (PI) or polyethylene terephthalate (PET) for example, but the present invention is not limited thereto.

The thin film transistor T is disposed on the surface 110a of the first substrate 110, and the thin film transistor T includes a gate G, a source S, a drain D, a GI layer 130 and a semiconductive active layer 140. For instance, the pixel structure 100 of this embodiment may further include a first conductive layer 120 and a second conductive layer 150, wherein the first conductive layer 120 is disposed on the surface 110a of the first substrate 110, the GI layer 130 is disposed on the first conductive layer 120, the semiconductive active layer 140 is disposed on the GI layer 130, and the second conductive layer 150 is disposed on the semiconductive active layer 140. The first conductive layer 120 includes the gate G of the thin film transistor T, the second conductive layer 150 includes the source S and the drain D of the thin film transistor T, and the gate G, the source S and the drain D respectively overlap a portion of the semiconductive active layer 140 in a direction perpendicular to the surface 110a of the first substrate 110. The GI layer 130 is configured to separate the gate G from the semiconductive active layer 140. Therefore, the thin film transistor T of this embodiment is a bottom-gate thin film transistor, but the present invention is not limited thereto. In another embodiment, the thin film transistor T may be a top-gate thin film transistor; for example, the GI layer 130 and the first conductive layer 120 including the gate G are disposed on the second conductive layer 150 including the source S and the drain D, the GI layer 130 is disposed between the first conductive layer 120 and the semiconductive active layer 140, and the semiconductive active layer 140 is disposed between the GI layer 130 and the second conductive layer 150. Moreover, the first conductive layer 120 and the second conductive layer 150 may include conductive material with good conductivity, such as metal material. The semiconductive active layer 140 may include one of indium gallium zinc oxide (IGZO), indium tin zinc oxide (ITZO), indium gallium oxide (IGO), indium zinc oxide (IZO), gallium oxide, cadmium oxide, magnesium oxide, calcium oxide, strontium oxide, barium oxide, titanium oxide, tantalum oxide, aluminum oxide, indium oxide, niobium oxide, hafnium oxide, tin oxide, zinc oxide, zirconium oxide, copper oxide, yttrium oxide, barium yttrium oxide, and samarium tin oxide or any combination thereof, but the present invention is not limited thereto. In addition, for example, when the semiconductive active layer 140 is IGZO layer, a portion of the GI layer 130 located closer to the semiconductive active layer 140 may include silicate material, but the present invention is not limited thereto.

With regards to the thin film transistor T of this embodiment, the semiconductive active layer 140 has a channel region 140a disposed between the source S and the drain D, wherein the channel region 140a includes at least one main channel region 140m and at least one sub channel region 140s. For instance, FIG. 1 and FIG. 2 show three main channel regions 140m and four sub channel regions 140s, and the main channel regions 140m and the sub channel regions 140s alternate with each other, wherein the main channel regions 140m and the sub channel regions 140s are separated by dash lines in the figures, but the numbers and dispositions of the main channel region 140m and the sub channel region 140s are not limited thereto. The channel length L1 of each main channel regions 140m is less than the channel lengths (for instance, L2~L5) of the sub channel regions 140s and equal to a minimum of a channel length of the channel region 140a (i.e., the minimum of the channel length of the channel region 140a is indicated by L1). Note that the channel length of the channel region 140a is referred to a distance of the channel region 140a from the drain D to the source S; that is to say, since the channel length L1 of the main channel region 140m is equal to the minimum of the channel length of the channel region 140a, a resistance of the main channel region 140m is less than a resistance of the sub channel region 140s. Thus, when the thin film transistor T is turned on, the main channel region 140m is a main conductive path between the drain D and the source S. In addition, the semiconductive active layer 140 further has a back channel region 140b (shown in FIG. 3) situated between the source S and the drain D, the channel region 140a and the back channel region 140b are situated at two opposite sides of the semiconductive active layer 140 respectively, and the channel region 140a and the back channel region 140b overlap with each other in the direction perpendicular to the surface 110a of the first substrate 110. In other words, the back channel region 140b and the channel region 140a shown in FIG. 3 are respectively situated at a top side and a bottom side of the semiconductive active layer 140. In this embodiment, the channel region 140a is at the side of the semiconductive active layer 140 closer to the gate G, the back channel region 140b is at the side of the semiconductive active layer 140 farther from the gate G, but the present invention is not limited thereto. In this embodiment, the channel length L1 of the main channel region 140m may range from 2.5 µm to 5.5 µm, range from 3 µm to 5.3 µm, or range from 3.5 µm to 4.3 µm; that is to say, the minimum of the channel length of the channel region 140a (i.e., indicated by L1) is in the above range, but the present invention is not limited thereto. As shown in FIG. 1, the main channel region 140m of this embodiment is situated between the sub channel regions 140s, and the number of the main channel region 140m and the number of the sub channel region 140s may be more than one. For instance, FIG. 1 shows three main channel regions 140m. However, the location and number of the main channel regions 140m and sub channel regions 140s are not limited to the this embodiment and may be designed based on requirements. For example, the channel region 140a may have one main channel region 140m and a plurality of sub channel regions 140s.

Furthermore, in this embodiment, the pixel structure 100 may further include a scan line SL and a data line DL, the scan line SL is configured to transmit a control signal to renew frames, and the data line DL is configured to transmit a control signal of gray level. The scan line SL may extend along a first direction D1 and be electrically connected to the gate G of the thin film transistor T, the data line DL may extend along a second direction D2 and be electrically connected to the source S of the thin film transistor T, wherein the first direction D1 is not parallel to the second direction D2. In this embodiment, the first direction D1 is perpendicular to the second direction D2, but the present invention is not limited thereto. In addition, the scan line SL of this embodiment may be formed of the first conductive layer 120, the data line DL of this embodiment may be formed of the second conductive layer 150, therefore, the scan line SL and the gate G electrically connected to each other are included in the first conductive layer 120, and the data line DL and the source S electrically connected to each other are included in the second conductive layer 150, but the present invention is not limited thereto. Note that the source S of the thin film transistor T of this embodiment may have a first part S1 and a second part S2, the first part S1 includes a portion of the data line DL close to the semiconductive active layer 140 (that is, the first part S1 and the data line DL overlap partially), and the second part S2 protrudes from the data line DL, such that the source S has a hook-shape, so as to increase an area of the channel region 140a and increase the region with the minimum distance between the source S and the drain D (that is, to increase the area of the main channel region 140m), thereby reducing the resistance of the thin film transistor T when the thin film transistor T is turned on, but the disposition of the source S is not limited thereto.

The pixel electrode (or referred as the second transparent conductive layer) 160 is disposed on the GI layer 130 and electrically connected to the drain D of the thin film transistor T, such that the control signal of the gray level may be transmitted to the pixel electrode 160 through the data line DL and the thin film transistor T. In this embodiment, the pixel electrode 160 and the second conductive layer 150 may be disposed on the GI layer 130 directly, and the pixel electrode 160 may be in contact with the second conductive layer 150 for being electrically connected to each other. In other words, the pixel electrode 160 and the second conductive layer 150 may be electrically connected to each other without a through hole, but the present invention is not limited thereto. The first insulating layer 170 is disposed on the pixel electrode 160, and may be disposed on the thin film transistor T. The common electrode (or referred as the first transparent conductive layer) 180 is disposed on the first insulating layer 170 and the pixel electrode 160; that is to say, the first insulating layer 170 is disposed between the common electrode 180 and the pixel electrode 160, and the common electrode 180 is configured to be electrically connected to a common voltage. The liquid crystal layer LC is disposed between the first substrate 110 and the second substrate 190, and the liquid crystal layer LC is disposed on the common electrode 180. Thus, when the thin film transistor T is turned on, the pixel electrode 160 may receive the control signal of the gray level transmitted by the data line DL, such that liquid crystal molecules of the liquid crystal layer LC may be controlled by a coupling electrical field generated from the pixel electrode 160 and the common electrode 180 to display the gray level of the frame depending on the control signal of the gray level. Moreover, in order to generate the good coupling electrical field for precisely controlling the liquid crystal molecules, the common electrode 180 of this embodiment may have a plurality of slits 180b, but the present invention is not limited thereto. In addition, each of the common electrode 180 and the pixel electrode 160 may include at least one of indium tin oxide (ITO) and indium zinc oxide (IZO), and the first insulating layer 170 may include silicon oxide, silicon nitride, silicon oxynitride, etc., but the present invention is not limited thereto. Furthermore, when the semiconductive active layer 140 includes IGZO, an oxygen content of a portion of the first insulating layer 170 located closer to the semiconductive active layer 140 may be greater than an oxygen content of a portion of the first insulating layer 170 located farther from the semiconductive active layer 140, but the present invention is not limited thereto.

Figure 5:
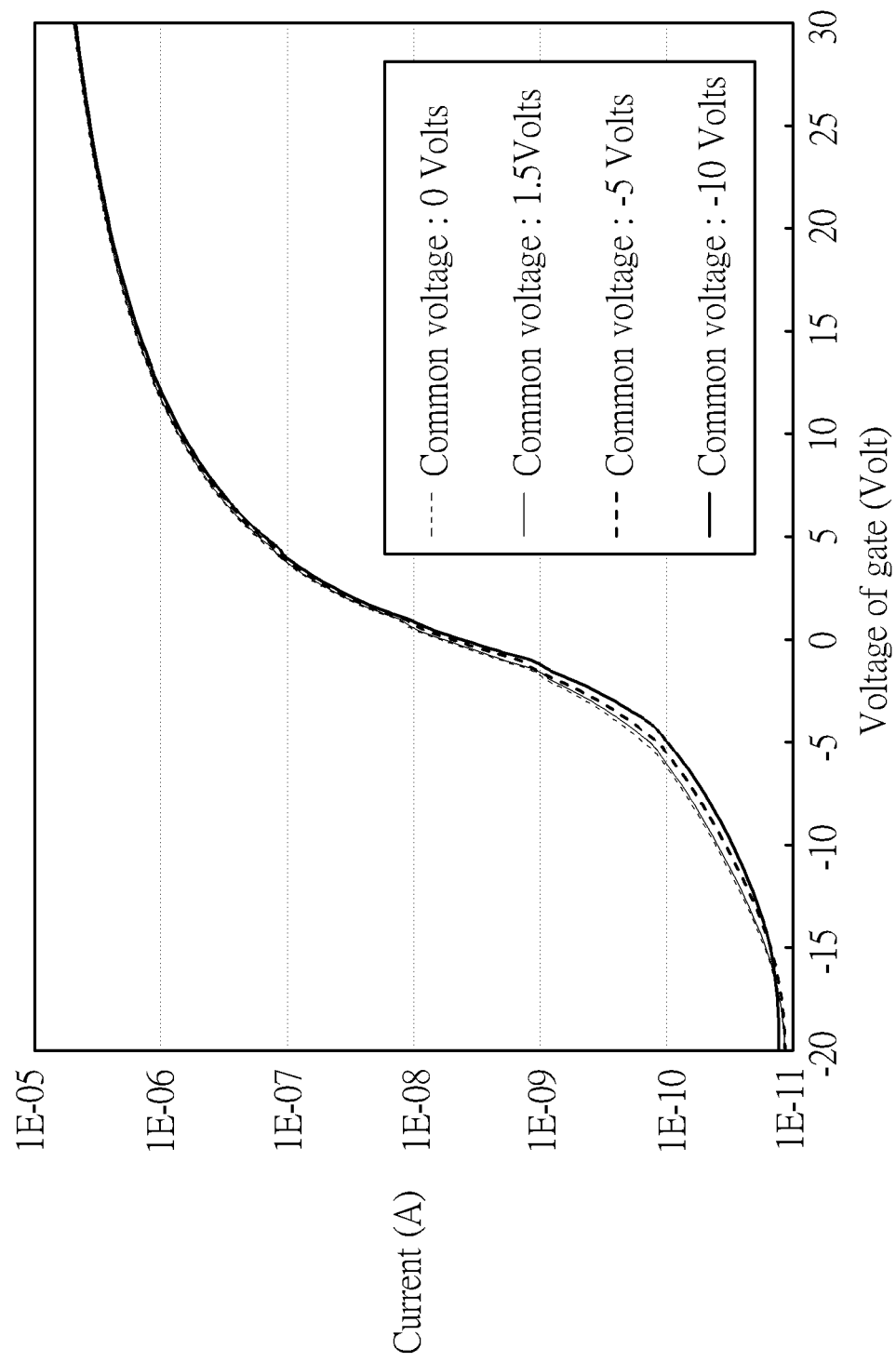
FIG. 5 is a schematic diagram illustrating a current-voltage characteristic curve of a thin film transistor of a pixel structure according to an embodiment of the present invention.

Generally, a small amount of current flows from the source S to the drain D or from the drain D to the source S through the back channel region 140b of the semiconductive active layer 140 when the thin film transistor T is turned off, and the small amount of current is referred as a leakage current. When the leakage current is too strong, the frames shown by the display may be abnormal, such as exhibiting flicker or crosstalk. In order to decrease the leakage current under the condition that the thin film transistor T of the pixel structure 100 is turned off, and not to significantly affect the resistance of the thin film transistor T under the condition that the thin film transistor T is turned on, the common electrode 180 of the pixel structure 100 of the present invention has an opening 180a configured to expose the main channel region 140m, and the common electrode 180 covers at least a portion of the sub channel regions 140s. That is to say, the region of the common electrode 180 close to the opening 180a may cover at least a portion of the sub channel regions 140s, and a vertical projection of the common electrode 180 on the surface 110a of the first substrate 110 does not overlap a vertical projection of the main channel region 140m on the surface 110a of the first substrate 110. Under this disposition, when the common electrode 180 is provided with the common voltage, because the common electrode 180 does not cover the main channel region 140m, the common electrode 180 does not influence the resistance of the main channel region 140m at turn-on and electrical disconnection of the main channel region 140m at turn-off. Also, since the main channel region 140m is a main conductive path between the drain D and the source S, the common electrode 180 provided with the common voltage does not significantly affect the resistance of the thin film transistor T under the condition that the thin film transistor T is turned on. On the other hand, when the thin film transistor T is turned off, because the common electrode 180 covers at least a portion of the sub channel regions 140s, the electrical disconnection effect of the back channel region 140b of the sub channel regions 140s overlapping the common electrode 180 may be enhanced due to the induction of the common voltage, so as to decrease the leakage current. FIG. 5 is a schematic diagram illustrating a current-voltage characteristic curve of a thin film transistor of a pixel structure according to an embodiment of the present invention, wherein the common voltage shown in FIG. 5 is less than or equal to 0 volts. As shown in FIG. 5, when the thin film transistor T is turned on, the currents are not significant different no matter what values of the common voltage are. As the result, the resistance of the thin film transistor T is not significantly affected at turn-on. On the other hand, when the thin film transistor T is turned off, the leakage current decreases as the negative common voltage is stronger. Therefore, in order to decrease the leakage current, the common voltage may be less than or equal to 0 volts, such as −1.5~−10 volts, but the present invention is not limited thereto. Under some condition or design, the common voltage may greater than 0 volts. Moreover, in this embodiment, in order to increase the overlapping area of the back channel region 140b and the common electrode 180, a vertical projection of the opening 180a of the common electrode 180 on the surface 110a of the first substrate 110 may be situated within a vertical projection of the semiconductive active layer 140 on the surface 110a of the first substrate 110; that is to say, an area of the opening 180a of the common electrode 180 may be less than an area of the semiconductive active layer 140, but the present invention is not limited thereto. Moreover, the opening 180a of the common electrode 180 may expose a portion of the sub channel regions 140s, so as to prevent the common electrode 180 from covering the main channel region 140m owing to an alignment error in the manufacturing process, thereby influencing the resistance of the thin film transistor T at turn-on. Preferably, a distance W between an edge of the vertical projection of the main channel region 140m on the surface 110a of the first substrate 110 and an edge of the vertical projection of the opening 180a of the common electrode 180 on the surface 110a of the first substrate 110 (as shown in FIG. 1) may be less than or equal to 2 μm, but the present invention is not limited thereto. In a variant embodiment, the common electrode 180 may totally cover the sub channel regions 140s. Furthermore, in this embodiment, the common electrode 180 may further cover the scan line SL, such that the electrical field generated from the scan line SL does not affect the electrical field generated from the common electrode 180 and the pixel electrode 160, so as to avoid the scan line SL affecting the frames of the display.

The pixel structure 100 may further include a shielding layer BM and a color filter layer CF disposed between the first substrate 110 and the second substrate 190. The shielding layer BM may be referred as a black matrix layer, material of the shielding layer BM includes such as black resin, chromium or other suitable shielding material. The shielding layer BM is configured to shield such as the thin film transistor T, the data line DL, the scan line SL, etc. The color filter layer CF is configured to make each pixel structure 100 generate a light with corresponding color. For instance, the color filter layer CF may include red, green and blue light-filtering material, such that each pixel structure 100 may generate one of red light, green light and blue light, and then, the frame may be formed through controlling the gray level and color mixing, but the color is not limited thereto. In this embodiment, the shielding layer BM and the color filter layer CF are disposed between the second substrate 190 and the liquid crystal layer LC, but the present invention is not limited thereto. In another embodiment, the shielding layer BM and/or the color filter layer CF may be disposed between the first substrate 110 and the liquid crystal layer LC; that is, COA (color filter on array) structure, BOA (black matrix on array) structure, etc. are within the scope of the present invention.

The pixel structure of the present invention is not limited to the above embodiments. Further embodiments or modifications of the present invention are described below. For ease of comparison, the same components will be labeled with the same symbol in the following description. The following description only details the differences between the embodiments, and same parts will not be redundantly described.

Figure 6:
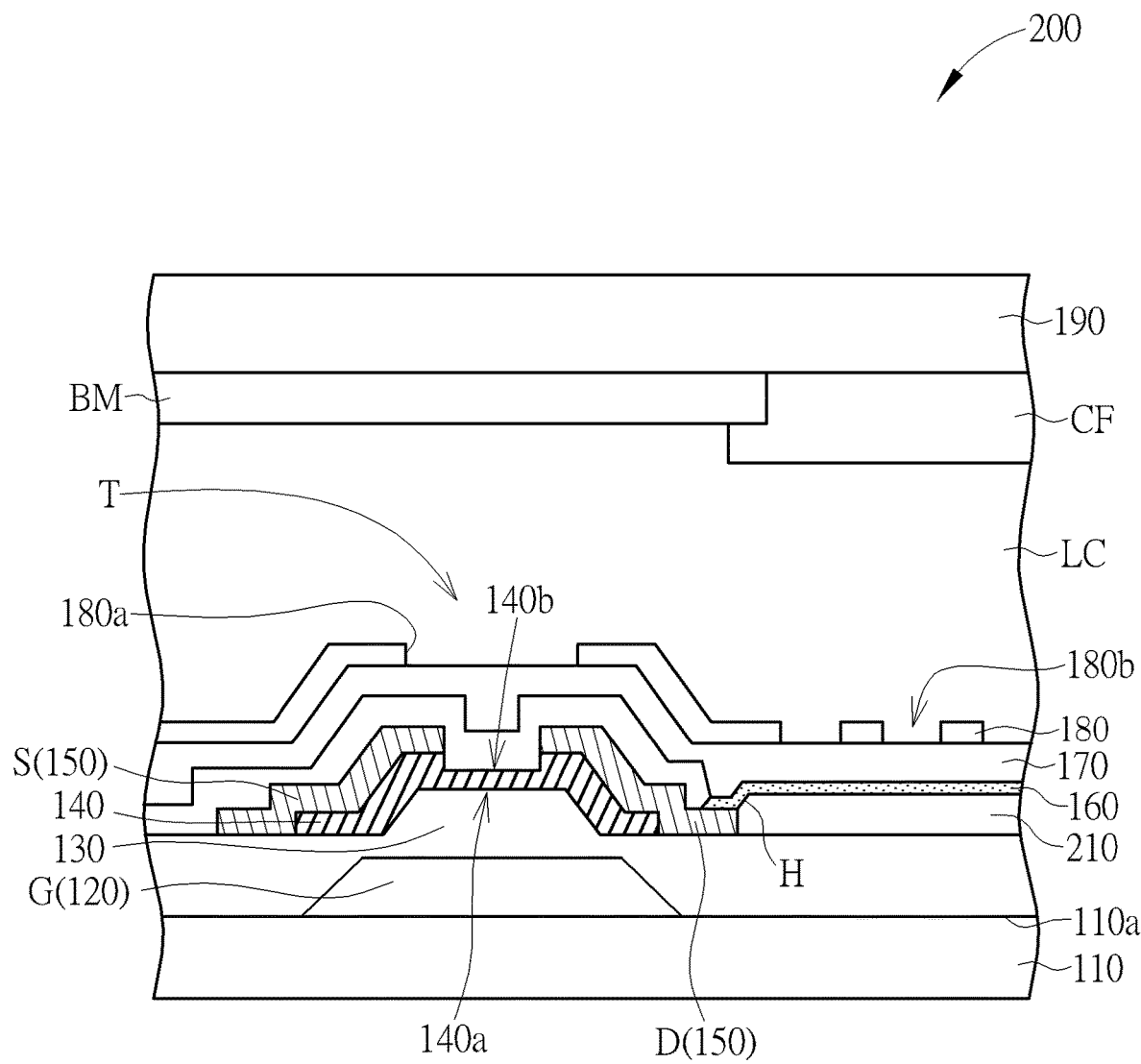
FIG. 6 is a cross-sectional-view schematic diagram illustrating a pixel structure according to a second embodiment of the present invention.

FIG. 6 is a cross-sectional-view schematic diagram illustrating a pixel structure according to a second embodiment of the present invention, wherein the profile position corresponds to the position in FIG. 3. As shown in FIG. 6, compared with the first embodiment, the pixel structure 200 of this embodiment further includes a second insulating layer 210 disposed between the pixel electrode 160 and the GI layer 130 and between the common electrode 180 and the GI layer 130. That is to say, in this embodiment, the pixel electrode 160 is situated between the first insulating layer 170 and the second insulating layer 210, and the common electrode 180 is situated on the first insulating layer 170 and the pixel electrode 160. In other words, the second insulating layer 210, the pixel electrode 160, the first insulating layer 170 and the common electrode 180 are stacked on the GI layer 130 sequentially, and the pixel electrode 160 may be electrically connected to the drain D through a connecting hole H of the second insulating layer 210. Moreover, in this embodiment, each of the first insulating layer 170 and the second insulating layer 210 may include at least one of silicon oxide, silicon nitride, silicon oxynitride, etc.; that is to say, the first insulating layer 170 and the second insulating layer 210 may be single-layer structures formed of an inorganic insulating material, but the present invention is not limited thereto. In another embodiment, the second insulating layer 210 may be a multi-layer structure; for instance, the second insulating layer 210 may be a two-layer structure, one layer may include the inorganic insulating material such as silicon oxide, silicon nitride, silicon oxynitride, etc., the other layer may include an organic insulating material such as acrylic resin (for example, polymethyl methacrylate (PMMA)), and the layer including the organic insulating material is disposed on the layer including the inorganic insulating material, but the present invention is not limited thereto. In this embodiment, because the pixel structure 200 has the first insulating layer 170 and the second insulating layer 210, the design of thicknesses of each layer will be more flexible, the distance between the pixel electrode 160 and the common electrode 180 may be adjusted easily.

Figure 7:
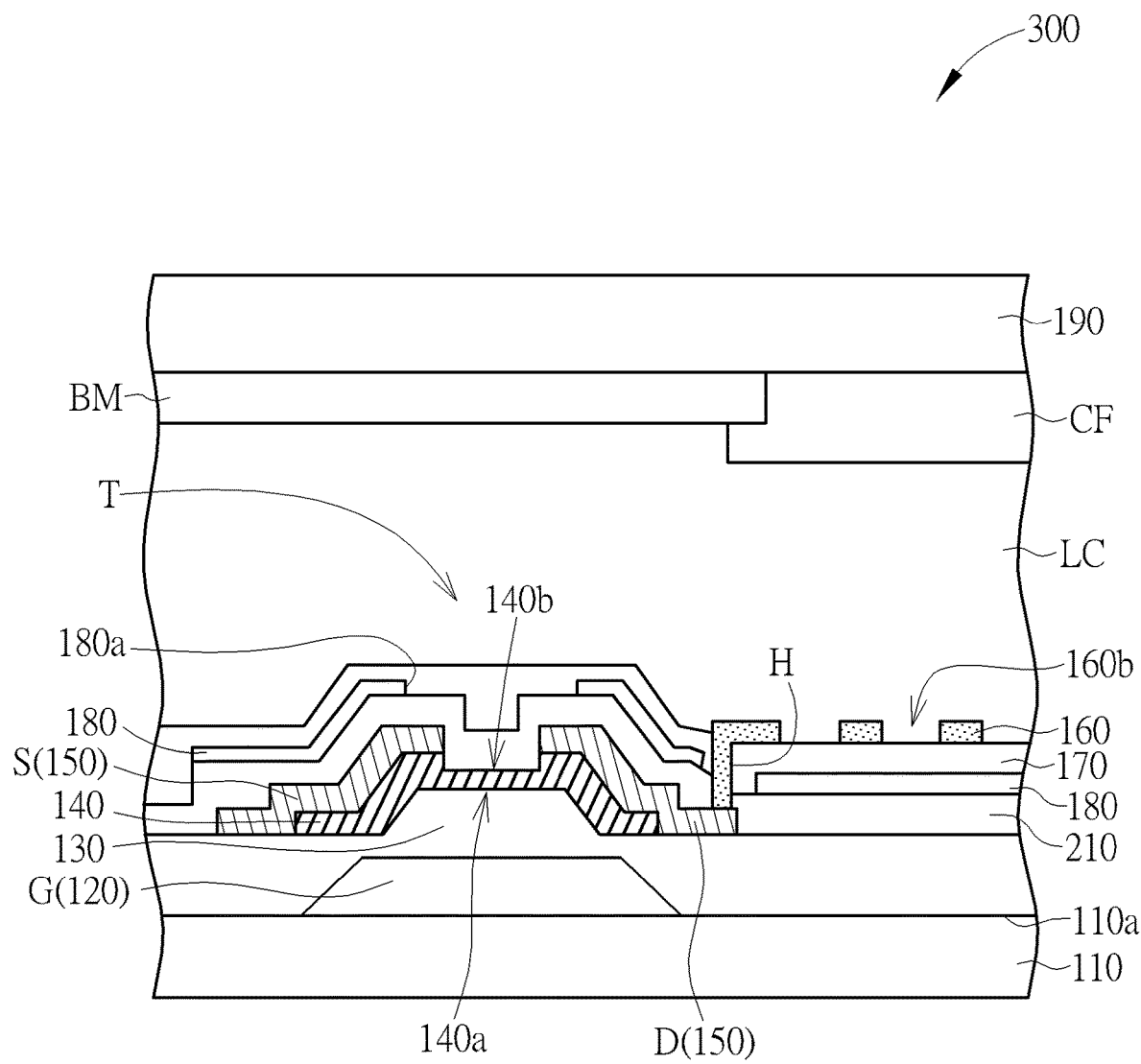
FIG. 7 is a cross-sectional-view schematic diagram illustrating a pixel structure according to a third embodiment of the present invention.

FIG. 7 is a cross-sectional-view schematic diagram illustrating a pixel structure according to a third embodiment of the present invention, wherein the profile position corresponds to the position in FIG. 3. As shown in FIG. 7, compared with the second embodiment, the positions of the pixel electrode 160 and the common electrode 180 of the pixel structure 300 of this embodiment are exchanged. In other words, the common electrode 180 is situated between the first insulating layer 170 and the second insulating layer 210, the pixel electrode 160 is situated on the first insulating layer 170 and the common electrode 180, and therefore, the second insulating layer 210, the common electrode 180, the first insulating layer 170 and the pixel electrode 160 are stacked on the GI layer 130 sequentially. Furthermore, in this embodiment, the pixel electrode 160 is closer to the liquid crystal layer LC than the common electrode 180, thus, the pixel electrode 160 may have a plurality of slits 160b, and the common electrode 180 may not have the slit. The description of the second insulating layer 210 may referred to the second embodiment, and not be redundantly described.

Figure 8:
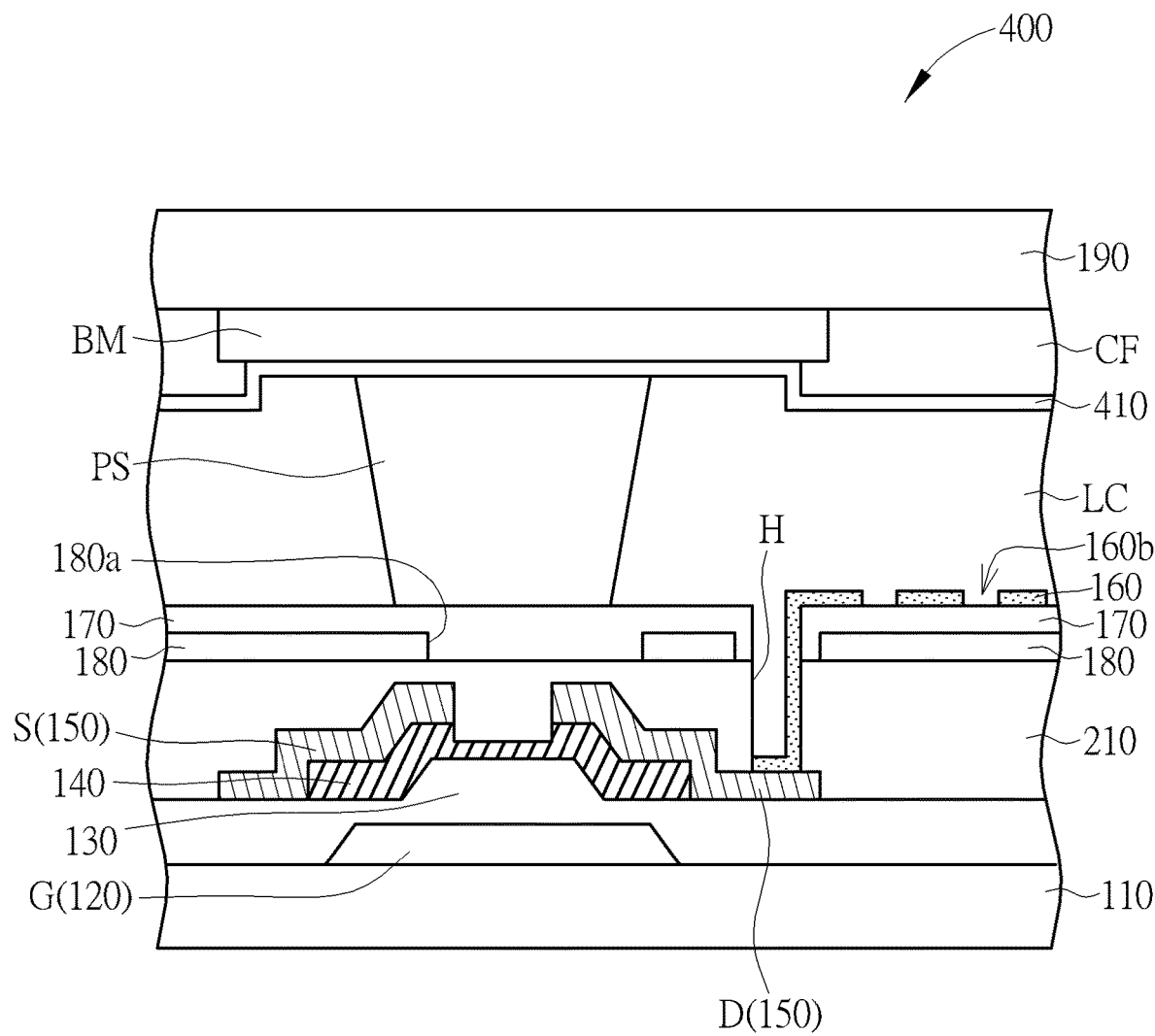
FIG. 8 is a cross-sectional-view schematic diagram illustrating a pixel structure according to a fourth embodiment of the present invention.

FIG. 8 is a cross-sectional-view schematic diagram illustrating a pixel structure according to a fourth embodiment of the present invention. As shown in FIG. 8, compared with the third embodiment, the pixel structure 400 of this embodiment further includes a third transparent conductive layer 410 disposed between the second substrate 190 and the liquid crystal layer LC. The third transparent conductive layer 410 is electrically connected to the common voltage, such that the display including the pixel structure 400 of the fourth embodiment may be a twisted nematic (TN) display. Note that the common electrode 180 of this embodiment covers at least a portion of the sub channel regions 140s, but the common electrode 180 is not provided with the common voltage. Therefore, in this embodiment, the liquid crystal molecules of the liquid crystal layer LC may be controlled by an electrical field generated from the pixel electrode 160 and the third transparent conductive layer 410 to display the gray level of the frame. In addition, FIG. 8 further shows a spacing unit PS configured to support the space between the first substrate 110 and the second substrate 190. In this embodiment, the spacing unit PS is disposed on the first insulating layer 170. The second insulating layer 210 of this embodiment includes an organic insulating material and has a function of flattening. The thickness of the second insulating layer 210 in FIG. 8 is greater than the thicknesses of the second insulating layers 210 shown in FIG. 6 and FIG. 7. Note that the display formed by the pixel structures of other embodiments or variant embodiments may have the spacing unit shown in FIG. 8.

Figure 9:
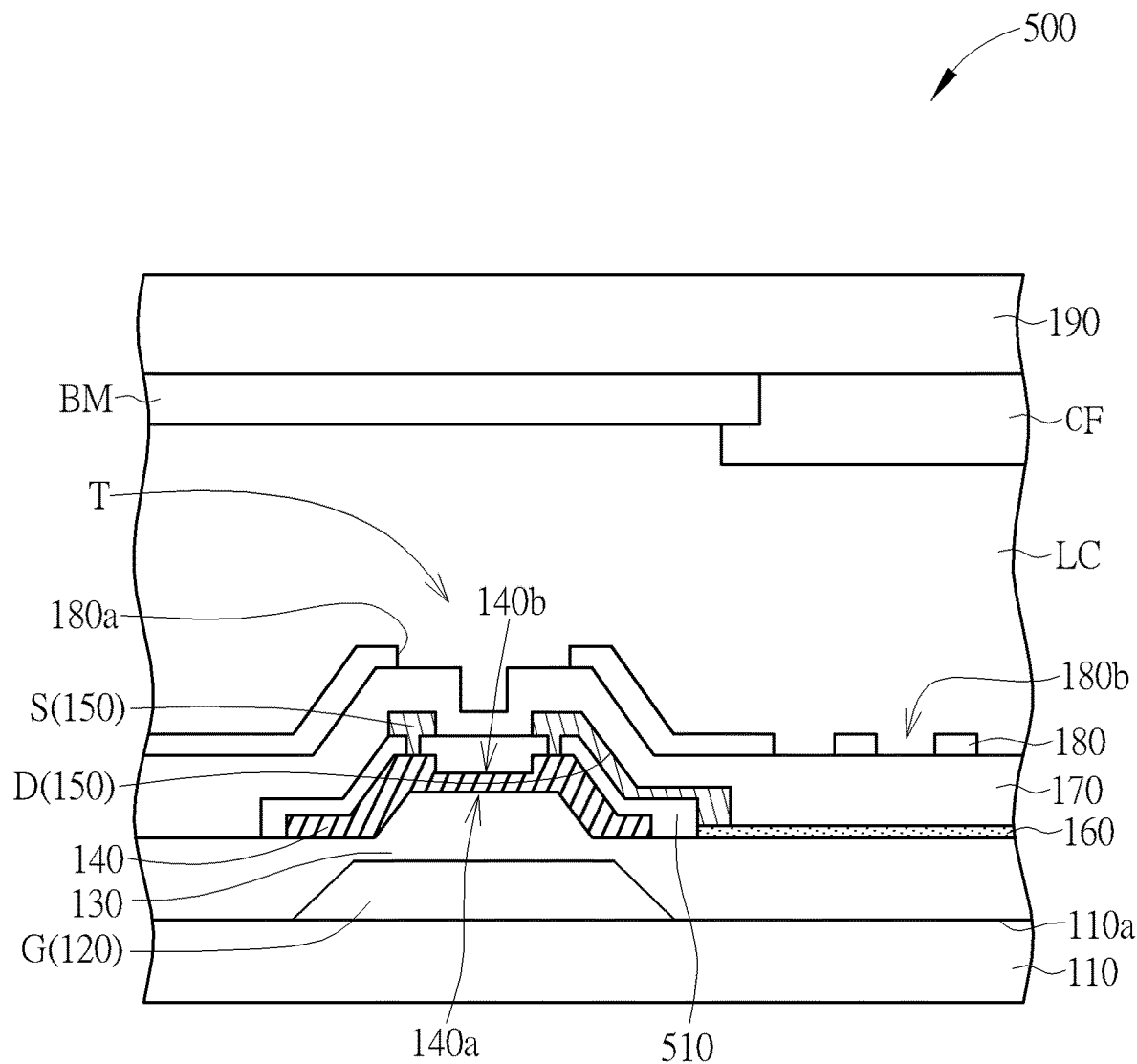
FIG. 9 is a cross-sectional-view schematic diagram illustrating a pixel structure according to a fifth embodiment of the present invention.

FIG. 9 is a cross-sectional-view schematic diagram illustrating a pixel structure according to a fifth embodiment of the present invention. As shown in FIG. 9, compared with the first embodiment, the pixel structure 500 of this embodiment further includes an insulating layer 510 covering the semiconductive active layer 140. The insulating layer 510 has two through holes, such that the source S and the drain D may be electrically connected to the semiconductive active layer 140 through two through holes respectively. In this embodiment, the semiconductive active layer 140 may include oxide semiconductor material, such as IGZO, but the present invention is not limited thereto.

Figure 10:
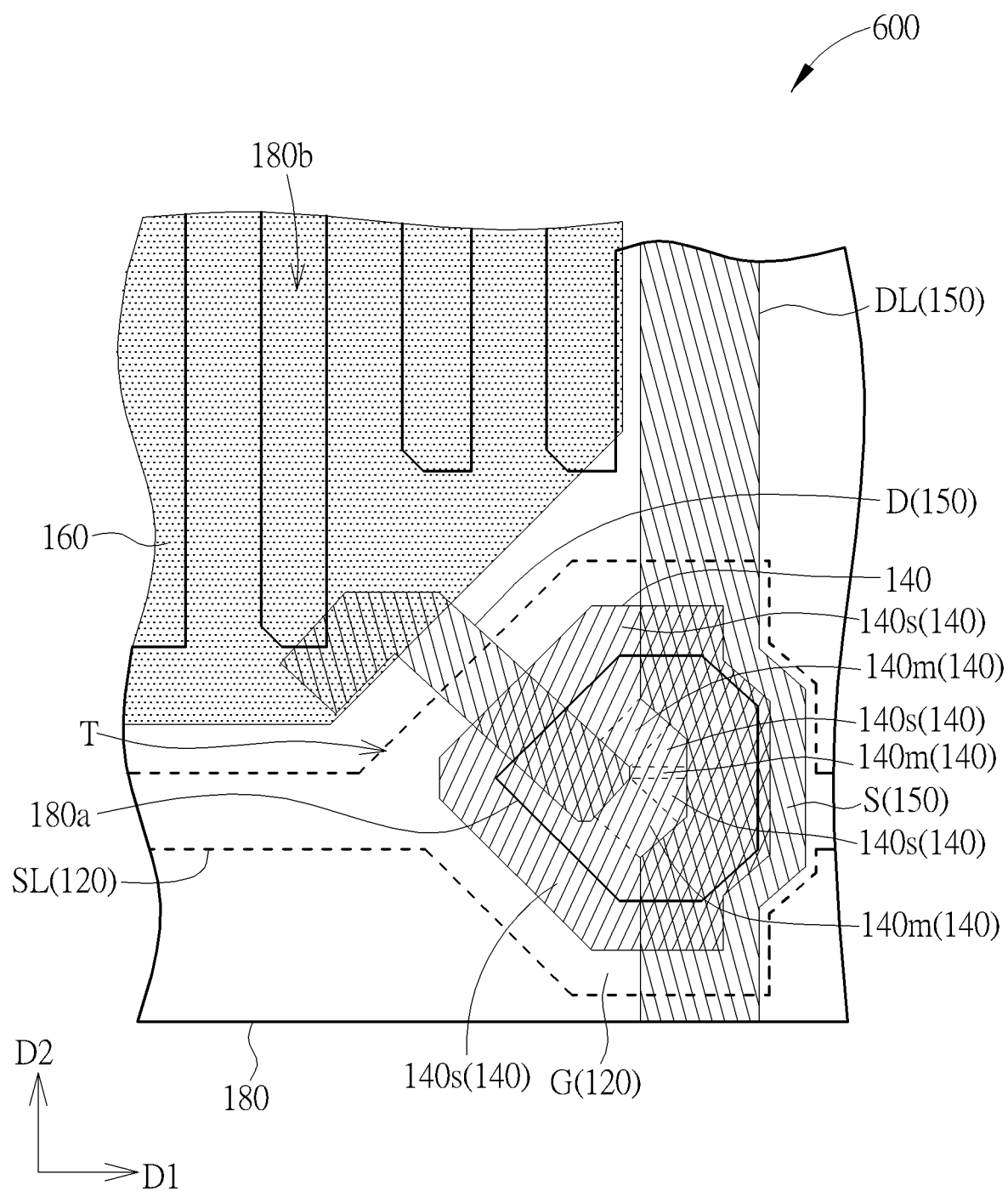
FIG. 10 is a top-view schematic diagram illustrating a portion of a pixel structure according to a sixth embodiment of the present invention.
Figure 11:
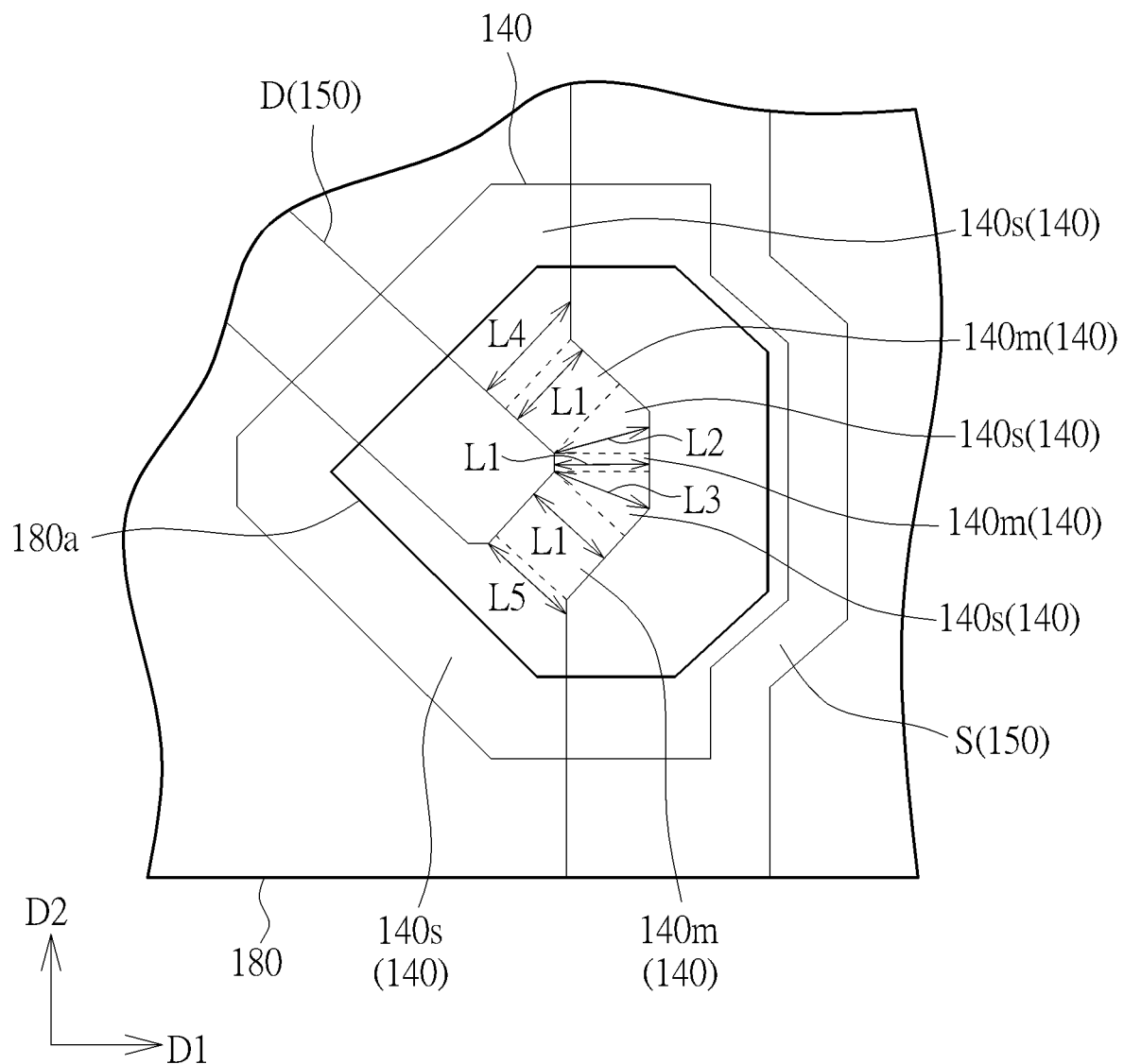
FIG. 11 is a partial enlarged schematic diagram of FIG. 10.

FIG. 10 is a top-view schematic diagram illustrating a portion of a pixel structure according to a sixth embodiment of the present invention, FIG. 11 is a partial enlarged schematic diagram of FIG. 10, wherein FIG. 11 does not illustrate screentones of the semiconductive active layer and the second conductive layer in order to clearly show the distribution of regions within the semiconductive active layer. As shown in FIG. 10 and FIG. 11, compared with the first embodiment, the source S of the thin film transistor T of the pixel structure 600 of this embodiment has a bending shape or a curved shape. Therefore, the source S of this embodiment is a portion of the data line DL; that is to say, the portion of the data line DL configured to be the source S or a portion of the data line DL close to the channel region 140a has the bending shape or the curved shape. Similarly, the main channel region 140m of this embodiment is situated between the sub channel regions 140s, and FIG. 10 and FIG. 11 show three main channel regions 140m and four sub channel regions 140s, but the numbers and dispositions of the main channel region 140m and the sub channel region 140s are not limited thereto. Furthermore, selectively, the vertical projection of the opening 180a of the common electrode 180 on the surface 110a of the first substrate 110 may be situated within the vertical projection of the semiconductive active layer 140 on the surface 110a of the first substrate 110, and the opening 180a of the common electrode 180 may expose a portion of the sub channel regions 140s.

In summary, the common electrode of the pixel structure of the present invention has the opening configured to expose the main channel region and covers at least a portion of the at least one sub channel region. Thus, when the common electrode is provided with the common voltage, because the common electrode does not cover the main channel region, the common electrode does not significantly affect the resistance of the thin film transistor under the condition that the thin film transistor is turned on. On the other hand, when the thin film transistor is turned off, because the common electrode covers at least a portion of the at least one sub channel region, the electrical disconnection effect of the back channel region of the at least one sub channel region overlapping the common electrode can be enhanced due to the induction of the common voltage, so as to decrease the leakage current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure, comprising:
a substrate having a surface;
a thin film transistor disposed on the surface of the substrate, the thin film transistor comprising a gate, a source, a drain, a gate insulating layer and a semiconductive active layer, wherein the gate, the source and the drain respectively overlap a portion of the semiconductive active layer in a direction perpendicular to the surface, the gate insulating layer is disposed between the gate and the semiconductive active layer, the semiconductive active layer has a channel region disposed between the source and the drain, the channel region comprises a main channel region and at least one sub channel region, a channel length of the main channel region is less than a channel length of the at least one sub channel region, and the channel length of the main channel region is equal to a minimum of a channel length of the channel region, wherein the channel length of the channel region is a distance of the channel region from the drain to the source; and a common electrode disposed on the thin film transistor, the common electrode overlapping at least a portion of the at least one sub channel region, wherein the common electrode has an opening exposing the main channel region.

2. The pixel structure of claim 1, wherein a vertical projection of the common electrode on the surface does not overlap a vertical projection of the main channel region on the surface.

3. The pixel structure of claim 1, wherein a vertical projection of the opening on the surface is situated within a vertical projection of the semiconductive active layer on the surface.

4. The pixel structure of claim 1, wherein the opening exposes a portion of the at least one sub channel region.

5. The pixel structure of claim 1, wherein a distance between an edge of a vertical projection of the main channel region on the surface and an edge of a vertical projection of the opening on the surface is less than or equal to 2 µm.

6. The pixel structure of claim 1, further comprising:
a pixel electrode disposed on the gate insulating layer and electrically connected to the drain of the thin film transistor; and
a first insulating layer disposed between the pixel electrode and the common electrode.

7. The pixel structure of claim 6, wherein the common electrode is disposed on the first insulating layer and the pixel electrode.

8. The pixel structure of claim 6, further comprising a second insulating layer disposed between the pixel electrode and the gate insulating layer and disposed between the common electrode and the gate insulating layer.

9. The pixel structure of claim 8, wherein the pixel electrode is disposed between the first insulating layer and the second insulating layer, and the common electrode is disposed on the first insulating layer and the pixel electrode.

10. The pixel structure of claim 8, wherein the common electrode is disposed between the first insulating layer and the second insulating layer, and the pixel electrode is disposed on the first insulating layer and the common electrode.

11. The pixel structure of claim 8, wherein each of the first insulating layer and the second insulating layer comprises at least one of silicon oxide, silicon nitride and silicon oxynitride.

12. The pixel structure of claim 11, wherein the second insulating layer further comprises an organic insulating material.

13. The pixel structure of claim 6, wherein the semiconductive active layer comprises indium gallium zinc oxide (IGZO), and an oxygen content of a portion of the first insulating layer located closer to the semiconductive active layer is greater than an oxygen content of a portion of the first insulating layer located farther from the semiconductive active layer.

14. The pixel structure of claim 6, wherein the common electrode or the pixel electrode has a plurality of slits.

15. The pixel structure of claim 1, further comprising:
a scan line extending along a first direction and electrically connected to the gate of the thin film transistor; and
a data line extending along a second direction and electrically connected to the source of the thin film transistor, wherein the first direction is not parallel to the second direction,
wherein the source has a first part and a second part, the first part comprises a portion of the data line, the second part protrudes from the data line, and the source has a hook-shape.

16. The pixel structure of claim 1, wherein the source has a bending shape or a curved shape.

17. The pixel structure of claim 1, wherein the common electrode is provided with a common voltage, and the common voltage is less than or equal to 0 volts.

18. The pixel structure of claim 1, wherein the channel length of the main channel region ranges from 2.5 µm to 5.5 µm.

19. The pixel structure of claim 1, wherein the semiconductive active layer comprises one of indium gallium zinc oxide (IGZO), indium tin zinc oxide (ITZO), indium gallium oxide (IGO), indium zinc oxide (IZO), gallium oxide, cadmium oxide, magnesium oxide, calcium oxide, strontium oxide, barium oxide, titanium oxide, tantalum oxide, aluminum oxide, indium oxide, niobium oxide, hafnium oxide, tin oxide, zinc oxide, zirconium oxide, copper oxide, yttrium oxide, barium yttrium oxide, and samarium tin oxide or any combination thereof.

20. The pixel structure of claim 19, wherein the semiconductive active layer is indium gallium zinc oxide layer, and a portion of the gate insulating layer located closer to the semiconductive active layer comprises silicate material.

21. A the pixel structure, comprising:
a first substrate having a surface;
a thin film transistor disposed on the surface of the first substrate, the thin film transistor comprising a gate, a source, a drain, a gate insulating layer and a semiconductive active layer, wherein the gate, the source and the drain overlap a portion of the semiconductive active layer in a direction perpendicular to the surface respectively, the gate insulating layer is disposed between the gate and the semiconductive active layer, the semiconductive active layer has a channel region disposed between the source and the drain, the channel region comprises a main channel region and at least one sub channel region, a channel length of the main channel region is less than a channel length of the at least one sub channel region, and the channel length of the main channel region is equal to a minimum of a channel length of the channel region, wherein the channel length of the channel region is referred to a distance of the channel region from the drain to the source;
a first transparent conductive layer disposed on the thin film transistor, the first transparent conductive layer covering at least a portion of the at least one sub channel region, wherein the first transparent conductive layer has an opening exposing the main channel region;
a second substrate disposed on the surface of the first substrate; and a liquid crystal layer disposed between the first substrate and the second substrate.

22. The pixel structure of claim 21, further comprising a second transparent conductive layer disposed between the second substrate and the liquid crystal layer, wherein the second transparent conductive layer is provided with a common voltage.

* * * * *